United States Patent
Hasebe et al.

(10) Patent No.: US 7,546,840 B2
(45) Date of Patent: Jun. 16, 2009

(54) METHOD FOR CLEANING REACTION CONTAINER AND FILM DEPOSITION SYSTEM

(75) Inventors: Kazuhide Hasebe, Nirasaki (JP); Daisuke Nozu, Atsugi (JP); Dong-Kyun Choi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/480,488

(22) PCT Filed: Mar. 8, 2002

(86) PCT No.: PCT/JP02/02200

§ 371 (c)(1),
(2), (4) Date: Dec. 15, 2003

(87) PCT Pub. No.: WO03/004722

PCT Pub. Date: Jan. 16, 2003

(65) Prior Publication Data

US 2004/0144320 A1 Jul. 29, 2004

(30) Foreign Application Priority Data

Jul. 5, 2001 (JP) .............................. 2001-204674

(51) Int. Cl.
*B08B 9/00* (2006.01)
*B44C 1/22* (2006.01)

(52) U.S. Cl. ........................... 134/22.1; 134/2; 134/11; 134/19; 134/35; 216/58; 216/67; 438/905; 438/906

(58) Field of Classification Search ................... 216/37, 216/67, 75; 134/11, 19, 35; 438/905, 906
See application file for complete search history.

(56) References Cited

U.S. PATENT DOCUMENTS 5,510,645 A * 4/1996 Fitch et al. ................... 257/522
5,702,970 A * 12/1997 Choi .............................. 438/3

(Continued)

FOREIGN PATENT DOCUMENTS

JP 2000-200782 7/2000

(Continued)

OTHER PUBLICATIONS

D. Choi, et al., "Cleaning Technique of Hot-wall Batch Type Ru CVD Equipment by Oxygen Gas", IEEE International Symposium on Semiconductor Manufacturing, Conference Proceedings, Oct. 8, 2001, pp. 301-304.

*Primary Examiner*—Shamim Ahmed
(74) *Attorney, Agent, or Firm*—Smith, Gambrell & Russell, LLP

(57) ABSTRACT

After semiconductor wafers are loaded into a reaction vessel, and ruthenium (Ru) film or ruthenium oxide film is formed, the interior of the reaction vessel is efficiently cleaned without contaminating the wafers. The interior of the reaction vessel is heated to a temperature of above 850° C. while the pressure inside the reaction vessel is reduced to, e.g., 133 pa (1 Torr)-13.3 Kpa (100 Torr), and oxygen gas is fed into the reaction vessel at a flow rate of, e.g., above 1.5 Lm, whereby the ruthenium film or the ruthenium oxide film formed inside the reaction vessel is cleaned off. In place of oxygen gas, active oxygen, such as O3, O* and OH*, etc. may be used.

1 Claim, 5 Drawing Sheets

U.S. PATENT DOCUMENTS

| | | | | |
|---|---|---|---|---|
| 6,003,526 | A | * | 12/1999 | Lo et al. .................. 134/1.1 |
| 6,143,192 | A | * | 11/2000 | Westmoreland ............ 216/101 |
| 6,176,930 | B1 | * | 1/2001 | Koai et al. ................. 118/715 |
| 6,537,461 | B1 | * | 3/2003 | Nakahara et al. ............. 216/67 |
| 6,635,185 | B2 | * | 10/2003 | Demmin et al. .............. 216/64 |
| 6,659,111 | B1 | * | 12/2003 | Mouri et al. ............... 134/22.1 |
| 2004/0163677 | A1 | * | 8/2004 | Takahashi et al. .......... 134/22.1 |

FOREIGN PATENT DOCUMENTS

| | | |
|---|---|---|
| JP | 2000-265275 | 9/2000 |
| JP | 2000-299289 | 10/2000 |

* cited by examiner

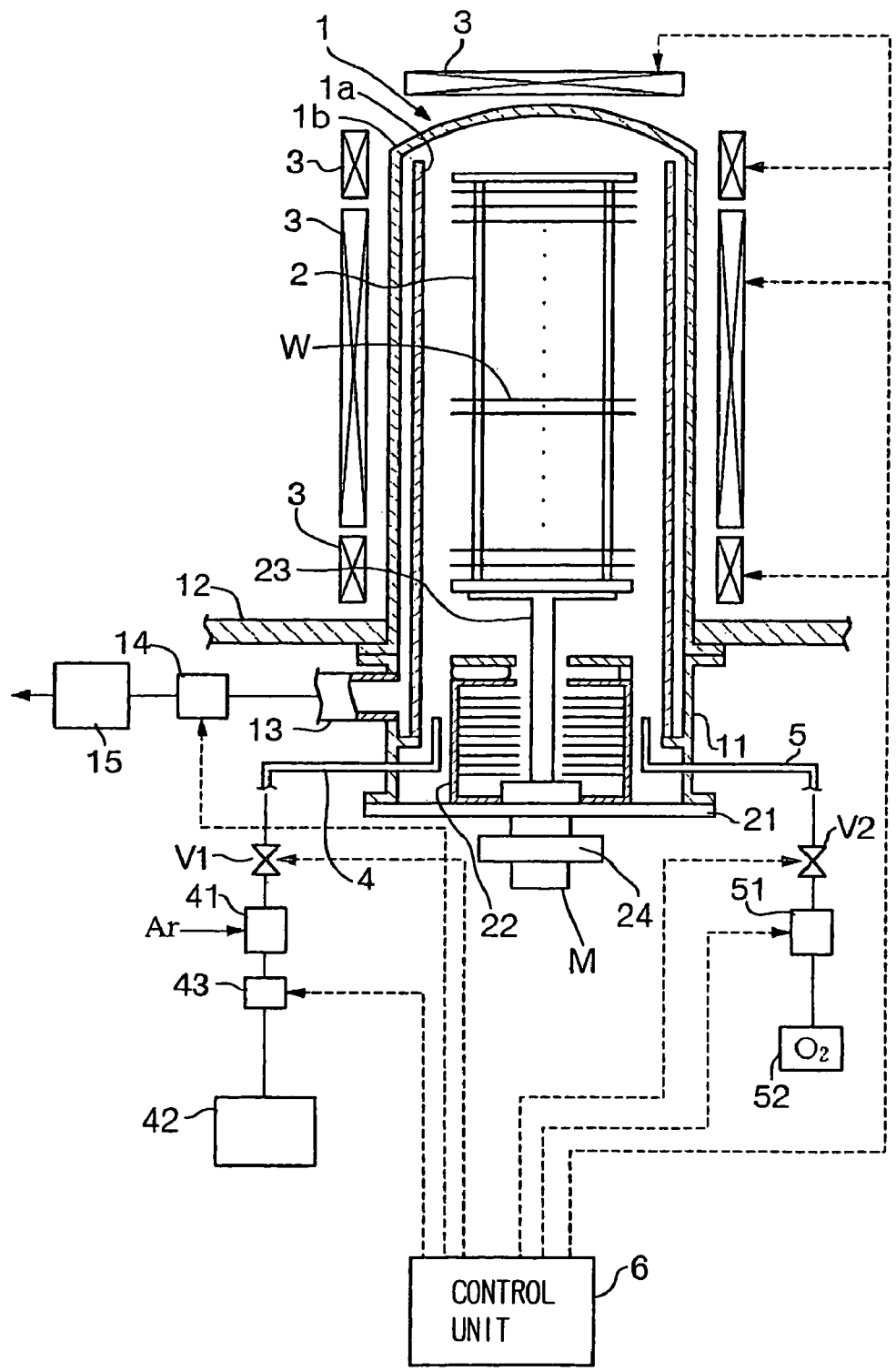
F I G. 1

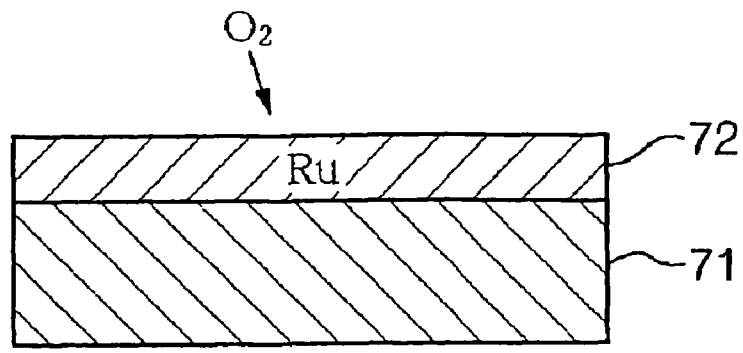
F I G. 2 A
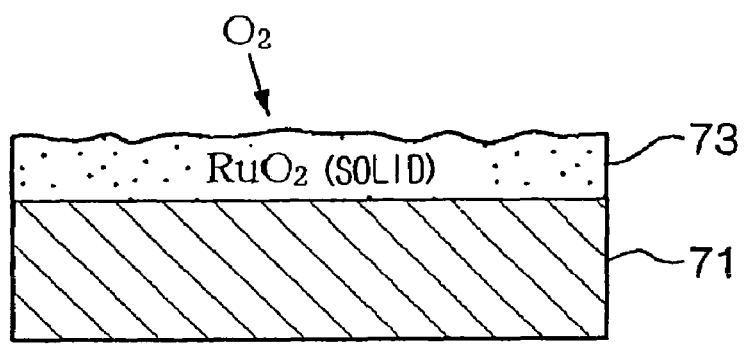
F I G. 2 B
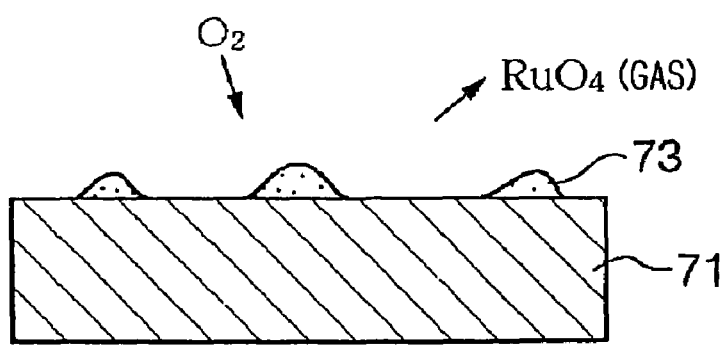
F I G. 2 C

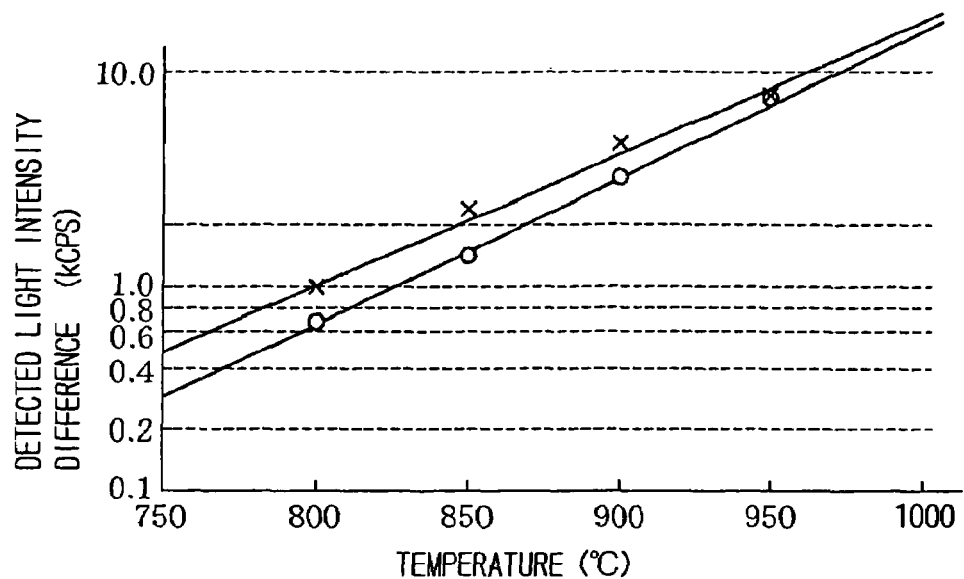
F I G. 3
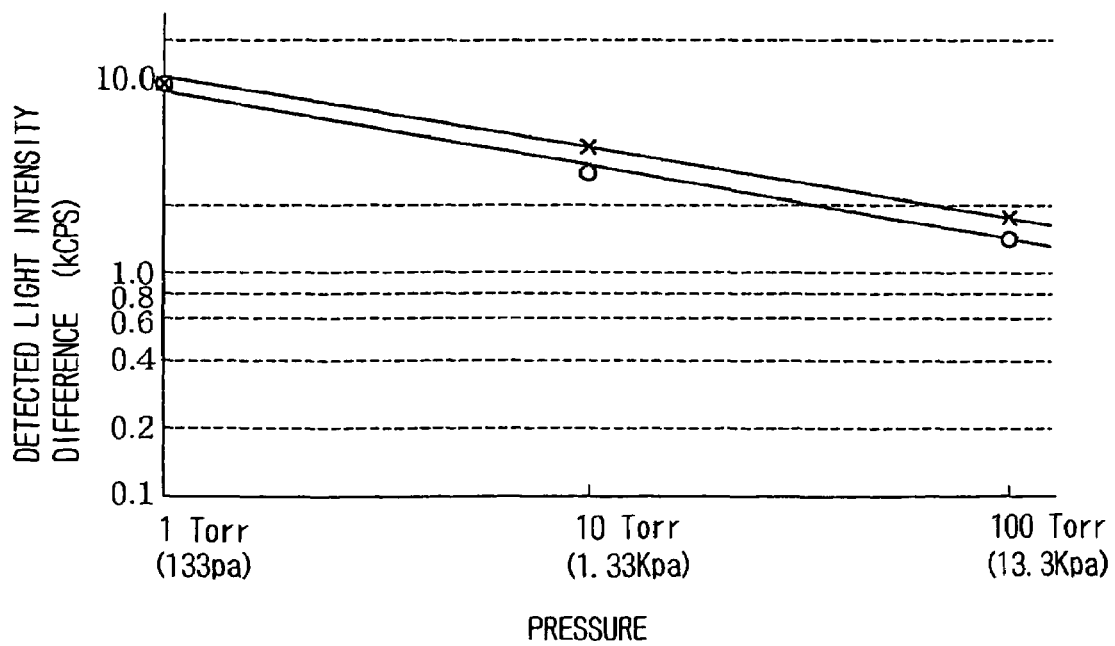
F I G. 4

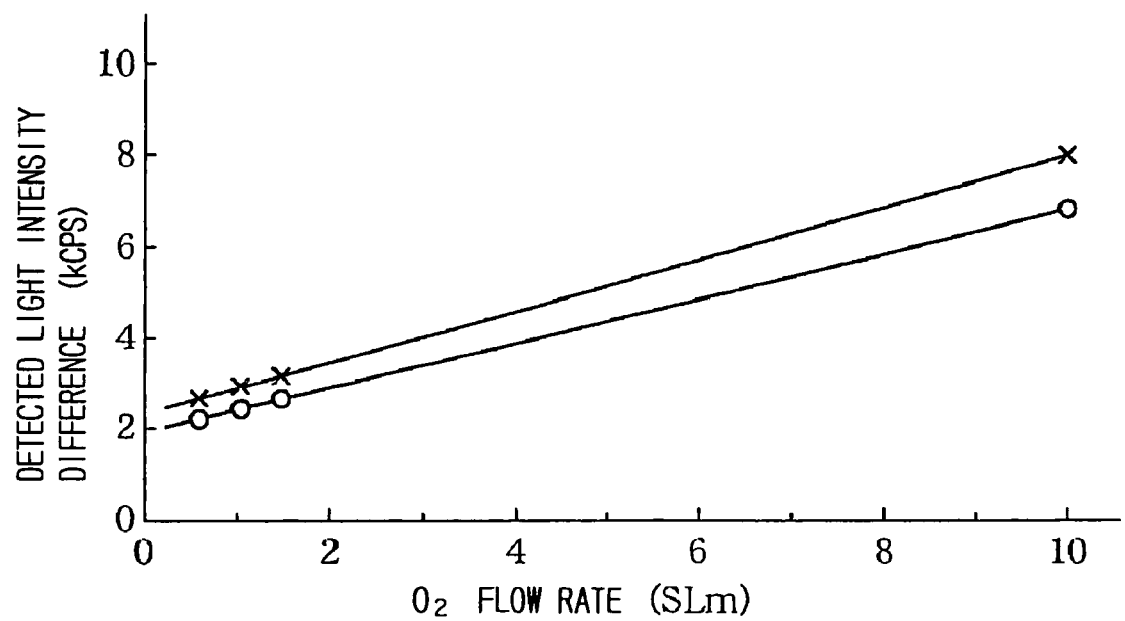
F I G. 5

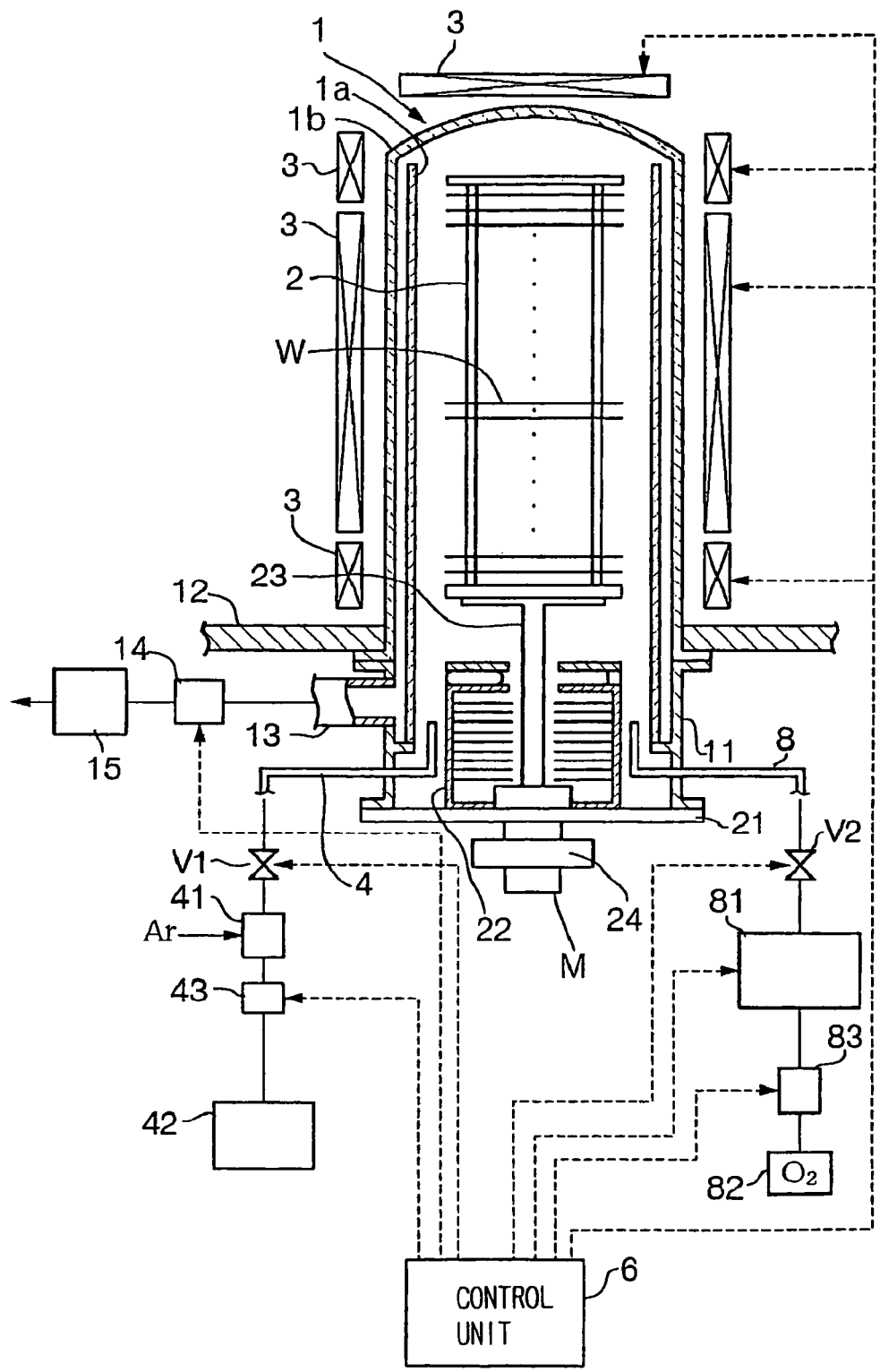
F I G. 6

METHOD FOR CLEANING REACTION CONTAINER AND FILM DEPOSITION SYSTEM

TECHNICAL FIELD

The present invention relates to a method for cleaning a reaction vessel for forming ruthenium film or ruthenium oxide film, and a film forming apparatus.

BACKGROUND ART

In semiconductor devices, to prevent the formation of an insulation film of low dielectric constant in the interface between the electrodes and the insulation film it is necessary to use materials which is not oxidized or exhibit metal conductivity when oxidized. The use of ruthenium (Ru) film or ruthenium oxide ($RuO_2$) film as electrode materials of the capacitors which meet such requirement is being studied.

Such films can be formed on wafers by CVD using $Ru(EtCP)_2$ as the raw material, by using an apparatus, e.g., a vertical thermal processing apparatus. Etisanethyl group, and CP is cyclopenthane ($C_5H_4$). Ruthenium film has the property of reflecting light, and when ruthenium film adheres to the inside of a reaction tube, the radiant heat from the heater outside the reaction tube is hindered from reaching the wafer. Resultantly, the temperature of the wafer becomes unstable, and films are released, which is a factor for causing contamination. Accordingly, the inside wall of the reaction tube must be cleaned frequently, e.g., after every one batch of processing, and the cleaning with, e.g., $ClF_3$ gas is being studied.

However, the reaction tube is generally formed of quartz, and the wafer boat is formed of quartz. The use of $ClF_3$ gas has a problem that the $ClF_3$ gas will damage them, and a risk that the $ClF_3$ gas may react with water intruding into the reaction tube from the processing gases or the air, causing HCl or HF to reside on the inside wall of the reaction vessel, the wafer boat etc., and scatter into films on the wafers.

In such circumstances the present invention has been made, and an object of the present invention is to provide a technique of cleaning the interior of a reaction vessel in which ruthenium film or ruthenium oxide film has been formed on objects-to-be-processed efficiently without damaging the reaction vessel and contaminating the objects-to-be-processed.

DISCLOSURE OF INVENTION

The present invention is a reaction vessel cleaning method for cleaning the interior of a reaction vessel in which processing of forming ruthenium film or ruthenium oxide film on objects-to-be-processed has been made characterized in that a low pressure of below 1.33 Kpa and a high-temperature atmosphere of above 850° C. are established in the reaction vessel, and oxygen gas as a cleaning gas is supplied into the reaction vessel.

According to the present invention, the cleaning can be performed in a short period of time without damaging quartz products used in the reaction vessel, as does the use of $ClF_3$ gas, and without the risk of contaminating the ruthenium film on the objects-to-be-processed.

Another invention is a reaction vessel cleaning method for cleaning the interior of a reaction vessel in which processing of forming ruthenium film or ruthenium oxide film on objects-to-be-processed has been made, characterized in that a gas containing active oxygen which is a cleaning gas is supplied into the reaction vessel.

The active oxygen is at least one of, e.g., $O_3$, oxygen radical and hydroxyl group radical.

The apparatus according to the present invention is a film forming apparatus for forming ruthenium film or ruthenium oxide film on objects-to-be-processed in a reaction vessel, comprising pressure adjusting means for adjusting a pressure in the reaction vessel; heating means for heating the interior of the reaction vessel; gas supply means for supplying oxygen gas into the reaction vessel; and a control unit including a program for establishing a low pressure of below 1.33 Kpa and a high-temperature atmosphere of above 850° C. in the reaction vessel and supplying oxygen gas as a cleaning gas into the reaction vessel, and means for controlling the respective means, based on the program, so as to clean the interior of the reaction vessel with the ruthenium film or the ruthenium oxide film adhering to.

BRIEF DESCRIPTION OF DRAWINGS

FIG. 1 is a vertical side view of a vertical thermal processing apparatus which is one example of the film forming apparatus used in one embodiment of the method according to the present invention.

FIG. 2A is a view illustrating the reaction of the ruthenium film with oxygen gas.

FIG. 2B is a view illustrating the reaction of the ruthenium film with the oxygen gas into $RuO_2$ (solid).

FIG. 2C is a view explaining the reaction of the $RuO_2$ (solid) further with oxygen into $RuO_4$ (gas).

FIG. 3 is a characteristic view of relationships between temperatures in the reaction vessel and detected light intensities of X-rays corresponding to scattering quantities of the ruthenium.

FIG. 4 is a characteristic view of relationships between pressures in the reaction vessel and detected light intensities of X-rays corresponding to scattering quantities of the ruthenium.

FIG. 5 is a characteristic view of relationships between flow rates of oxygen gas in the reaction vessel and detected light intensities of X-rays corresponding to scattering quantities of the ruthenium.

FIG. 6 is a vertical side view of a vertical thermal processing apparatus which is one example of the film forming apparatus used in another embodiment of the present invention.

BEST MODE FOR CARRYING OUT THE INVENTION

An embodiment of the cleaning method according to the present invention, wherein the cleaning method according to the present invention is applied to a vertical thermal processing apparatus will be explained. In FIG. 1, reference number 1 represent a reaction tube of a double structure of an inner tube 1a and an outer tube 1b which are formed of, e.g., quartz. A cylindrical manifold 11 of a metal is disposed on the bottom of the reaction tube 1. The inner tube 1a has the upper end opened and is supported on the inside of the manifold 11. The outer tube 1b has the upper end closed and has the lower end air tightly jointed to the upper end of the manifold 11. In the present embodiment, the inner tube 1a, the outer tube 1b and the manifold 11 constitute the reaction vessel. Reference number 12 represents a base plate.

In the reaction tube 1, a number of wafers W, objects-to-be-processed, e.g., 126 sheets of wafers are mounted on a wafer boat made of quartz, which is a holder, respectively horizontally at a certain interval in a shelves-like manner. The wafer boat 2 is held on a cap 21 with an installation region of a heat insulation unit 22 there between. The heat insulation unit 22 comprises a combination of a heat insulation unit of quartz fins or others and a heating unit. A rotary shaft 23 is passed through the center of the heat insulation unit 22, and the rotary shaft 23 is rotated by a motor M disposed on the boat elevator 24 to rotate the wafer boat 2.

The cap 21 is mounted on the boat elevator 24 for loading the wafer boat 2 into and out of the reaction tube 1 and, when the cap 21 is at the uppermost position, functions to close the lower end opening of the manifold 11, i.e., the lower end opening of the reaction vessel constituted by the reaction tube 1 and the manifold 11.

Around the reaction tube 1, there is provided a heater 3 which is heating means including, e.g., resistance heating single wires provided surrounding the reaction tube 1. In the present embodiment, reference number 3 represents for convenience all of a main heater which takes care of most of a thermal processing atmosphere in the reaction tube 1, sub-heaters disposed above and below the main heater and a sub-heater disposed on the ceiling. A furnace body is disposed around the heater 3, although not shown.

In the periphery of the manifold 11 there are provided a first gas supply pipe 4 for supplying film forming gases, and a second gas supply pipe 5 for supplying a cleaning gas so that the gases can be supplied into the inner tube 1a. The first gas supply pipe 4 is connected to a vaporizer 41 via valve V1, so that, Ru (EtCP)$_2$ liquid (bis (ethylcyclopenthane dienyl) ruthenium) supplied from a chemical liquid tank through a flow rate adjusting unit 43 is vaporized by, e.g., argon gas to be fed into the reaction tube 1. Et is an ethyl group, and CP is (C$_5$H$_4$). The second gas supply pipe 5 is connected to an oxygen gas supply source 52 via a valve V2 and a flow rate adjusting unit 51 which constitute gas supply means.

The manifold 11 is connected to an exhaust pipe 13 to be exhausted through a space between the inner tube 1a and the outer tube 1b, and the interior of the reaction tube 1 can be retained in a prescribed reduced atmosphere via pressure adjusting means, e.g., a butterfly valve.

The vertical thermal processing apparatus further comprises a control unit 6. The control unit 6 stores a program including a recipe for forming the film and a program including a recipe for the cleaning processing and includes means for controlling the electric power of the heater 3, and the valves V1, V2, the flow rare adjusting units 43, 51, the pressure adjusting means 14, etc., such as, e.g., a CPU as a data processing unit, etc.

Then, the operation of the above-described embodiment will be described. First, a prescribed number of wafers W, objects-to-be-processed, are held on the wafer boat 2 in the shelves-like manner, and the boat elevator 24 is lifted to load the wafer boat 2 into the reaction tube 1, more specifically into the reaction vessel (the state shown in FIG. 1). At the time of loading the wafer boat 2, the interior of the reaction tube 1 is retained at, e.g., about 200°C. The temperature in the reaction vessel is raised to a processing temperature, e.g., 300° C. after the wafer boat 2 has been loaded, closing the lower end opening of the reaction vessel with the cap 21, while the interior of the reaction vessel is evacuated to a prescribed vacuum degree by an evacuation pump through the exhaust pipe 13.

After the interior of the reaction vessel has been stabilized at the processing temperature, the valve V1 is opened to supply vapor of Ru (EtCP)$_2$ liquid vaporized by the vaporizer 41, a small quantity of oxygen gas for accelerating the decomposition of the raw materials and argon gas as the carrier gas are supplied into the reaction vessel through the first gas supply pipe 4 while the interior of the reaction vessel is adjusted to a prescribed vacuum degree by the pressure adjusting means 14, whereby ruthenium (Ru) film is formed on the wafers W. At this time, the wafer boat 2 is being rotated by the motor M. After the processing for forming the ruthenium film has been performed for a prescribed period of time, the supply of the processing gas is stopped, the temperature in the interior of the reaction vessel is lowered to 200° C., and the wafer boat 2 is unloaded out of the reaction vessel.

Such film forming processing forms the ruthenium film even on the reaction vessel (the reaction vessel 1 and the manifold 11), the wafer boat 2 and the heat insulation unit 22. Because ruthenium film has the property of reflecting light as described above, to stabilize the processing temperature of the wafers it is preferable to perform cleaning every time that the film forming processing, for example, is performed. Then, the cleaning processing as will be exemplified below is performed. First, the interior of the reaction tube 1 is retained at, e.g., about 300° C., the wafer boat 2 with no wafers W mounted on is loaded into the reaction vessel, and the interior of the reaction vessel is evacuated to a prescribed vacuum degree. Then, the supply power to the heater 3 is increased to raise the temperature of the interior of the reaction tube 1 to, e. g., 1000° C., and the valve V2 is opened. Oxygen gas as the cleaning gas is being supplied into the reaction vessel at, e.g., a 0.2-50.0 sLm flow rate, the pressure in the reaction vessel is adjusted to, e.g., 133 pa (1 Torr)-13.3 Kpa (100 Torr) by the pressure adjusting unit 14, and this condition is retained for a prescribed period of time. For this prescribed period of time, the cleaning processing is performed. This processing period of time depends on a film thickness of the ruthenium film to be formed on wafers W and a cleaning cycle (times of the film forming processing until the next cleaning), but when the ruthenium film of a 20 nm-thickness target is formed, the cleaning processing of, e.g., 20 minutes is performed for each film forming processing.

FIGS. 2A, 2B and 2C show the process of removing a ruthenium film 72 formed on the wall surface 71 of the reaction tube 2 by oxygen gas, which is represented by the ruthenium film formed on the inside surface of the wall surface 71. First, as shown in FIG. 2A, when oxygen contacts the ruthenium film 72, the reaction of Ru+O$_2$→RuO$_4$ (solid) takes place to form RuO$_2$ (solid) on the inside wall surface of the reaction vessel as shown in FIG. 2B. Then, the RuO$_2$ further contacts oxygen, and the reaction of RuO$_2$+O$_2$→RuO$_4$(gas) takes place. As shown in FIG. 2C, the RuO$_2$ (solid) sublimes in RuO$_4$ (gas). Thus, the ruthenium film 72 is cleaned off.

According to the present embodiment, in which the cleaning is performed with oxygen gas, the reaction tube 1 and the wafer boat 2, etc., which are formed of quartz, are not damaged by ClF$_3$ gas as described in the section "Related Background Art", and the problem that chlorine and fluorine adhere to the inside wall, etc. of the reaction tube and are taken into the ruthenium film does not take place. As will be evident in the examples which will be described later, the cleaning is performed in high-temperature atmospheres of above 850° C. and under low-pressure atmosphere of 1.33 Kpa, which permits the cleaning to be performed in a short period of time. The operational efficiency of the apparatus can be high.

EXAMPLES

The following experiments have been made to confirm the effects of the present invention. The experiment that a film is formed on the reaction tube of the vertical thermal processing apparatus described above and is removed is difficult to evaluate. In place of the cleaning experiment, here wafers with pre-formed ruthenium films are loaded in the reaction tube and exposed to oxygen gas to remove the ruthenium films.

Example 1

The pressure in the reaction tube was set at 1.33 Kpa, and the temperature of the cleaning (at the time of supplying oxygen gas) was varied to evaluate removed quantities of ruthenium films. The cleaning period of time was set at 30 minutes. For the evaluation of removed quantities of ruthenium films, removed quantities of ruthenium films removed by cleaning were given in differences between quantities of the ruthenium films before and after the cleaning, which were given by applying X rays to the respective ruthenium films on wafers before and after the cleaning and giving quantities of the ruthenium films, based on intensities of X-rays of the fluorescent X-rays reflected on the ruthenium films, which correspond to the energy of ruthenium. The results are as shown in FIG. 3. In FIG. 3, differences in the detected light intensity between the fluorescent X-rays before and after the cleaning are given, and the differences are indexes of removed quantities of the ruthenium films. In FIG. 3, "X" marks indicate the wafer mounted on the wafer boat 2 at a lower part. "O" marks indicate wafers mounted on the wafer boat 2 at an upper part. The "X" marks and the "O" marks are the same in FIGS. 4 and 5.

As seen in FIG. 3, the removed quantities of the ruthenium films are increased as the temperature are higher. This will be because the increase of the temperature will increase the reaction speed explained with reference to FIGS. 2A to 2C. The inventors of the present invention judges that when a detected light intensity difference is 1.5 kcps, the operational efficiency of the apparatus is sufficiently high. The reason for this is that when a detected intensity difference is 1.5 kcps, a rate of removing the ruthenium films of about 3.6 nm/minute, which is considerably high, can been ensured. Based on the result shown n FIG.3, when the temperature is above 850° C., the wafer at the upper part, where the removing rate of the ruthenium film is slow, the detected light intensity difference is above 1.5 kcps. Based on this, the temperature condition may be above 850° C.

The temperature inside the reaction tube 1 being above 850° C. here means that the part where the ruthenium film to be cleaned has a temperature of above 850° C. In the above case, the temperature of the inside wall surface of the inner tube 1a is above 850° C. The ruthenium adheres to the upper part of the outer tube 1b, but the ruthenium film does not adhere to the lower part because of a purge gas not shown flowing during the process.

As for the upper limit, because the removing quantities of the ruthenium films become larger as the temperature rises, the temperature must not be set to be below a specific temperature; the upper limit may be decided at sites. Based on the result of the experiments, by setting the upper limit to be above, e.g., 900° C., the cleaning can be made with considerably high efficiency.

Example 2

With the temperature inside the reaction tube set at 850° C. and pressures of the cleaning (upon the supply of oxygen gas) set at 133 pa (1 Torr), 1.33 Kpa (10 Torr) and 13.3 Kpa (100 Torr), removed quantities of the ruthenium film were evaluated. The cleaning period of time was set at 30 minutes. The removed quantities of the ruthenium film were evaluated in the same way as described above. The result is as shown in FIG. 4. As seen in FIG. 4, as the pressures are decreased, the removed quantities of the ruthenium film are larger. The reason for this will be that the evaporation of $RuO_4$ is more accelerated as the pressure is lower. Based on the result shown in FIG. 4, for the wafer on the upper part, where the removing rate of the ruthenium film is low, the detected light intensity difference is above 1.5 kcps when the pressure is below 1.33 Kpa. The pressure condition may be below 1.33 Kpa. The removed quantities of the ruthenium film are larger as the pressure is lower, however, it does not mean that the pressure must be below 1.33 Kpa.

Example 3

With the temperature inside the reaction tube set at 850° C., and the pressure set at 1.33 Kpa, the flow rate of oxygen gas was varied to evaluate the removed quantity of the ruthenium film. The cleaning period of time was set at 30 minutes. The evaluation of the removed quantities of the ruthenium film was performed in the same way as described above. The result is as shown in FIG. 5. Based on the result of FIG. 5, it can be seen that as the flow rate of the oxygen gas is increased, the removed quantity of the ruthenium film is larger. In the above-described apparatus, the flow rate of the oxygen gas maybe at least 0.2 sLm. A suitable flow rate of the oxygen gas depends on a size of the reaction tube and is determined by experiments made in advance for each apparatus.

In the above-described Example, the film to be cleaned in the present invention is not essentially ruthenium film but can be ruthenium oxide ($RuO_2$) film. Ruthenium oxide film is formed on wafers W by supplying into the reaction vessel oxygen gas in addition to the vapor of $Ru(EtCP)_2$. The ruthenium oxide film as well can be cleaned with oxygen gas in a low-pressure and high-temperature atmosphere as described above.

The cleaning gas can be active oxygen gas. The active oxygen gas can be, e.g., $O_3$ gas, O* (oxygen radical) and OH* (OH radical), etc. In the present invention, a gas containing, e.g., at least one of them can be used. The active oxygen can be O* and OH* generated in the process of introducing hydrogen gas and oxygen gas separately into, e.g., the reaction vessel and burning them in a low-pressure atmosphere.

In FIG. 6, a plasma generator 81 for generating plasmas by, e.g., applying a high voltage to a gas is disposed outside the reaction vessel. Oxygen gas is supplied to the plasma generator 81 from an oxygen gas supply source 82 via a flow rate adjusting unit 83, and the oxygen gas is formed into plasmas there to generate gas containing O*. The gas is supplied into the reaction vessel through a gas supply pipe 8 to clean the ruthenium film. Active oxygen gas is thus used, whereby the ruthenium film can be cleaned at lower temperatures than in the case that oxygen gas is not activated.

As described above, according to the present invention, in cleaning the interior of the reaction vessel after ruthenium film or ruthenium oxide film has been formed on objects-to-be-processed, the interior of the reaction vessel can be efficiently cleaned without damaging the reaction vessel and contaminating the objects-to-be-processed.

The invention claimed is:

1. A method for cleaning the interior of a reaction vessel used to form a ruthenium film or ruthenium oxide film on a workpiece, comprising:
    establishing a low pressure of below 1.33 Kpa and a high-temperature atmosphere of above 850° C in the reaction vessel,
    supplying a cleaning gas into the reaction vessel, the cleaning gas consisting of oxygen radicals and hydroxyl group radicals in combination, and
    controlling temperature and pressure within the reaction vessel to clean the interior thereof of the ruthenium film or ruthenium oxide film.

* * * * *